US011403251B2

(12) United States Patent
Li et al.

(10) Patent No.: US 11,403,251 B2
(45) Date of Patent: Aug. 2, 2022

(54) SINGLE-WIRE TRANSMISSION METHOD, CHIP AND COMMUNICATION SYSTEM

(71) Applicant: Chipone Technology (Beijing) Co., Ltd., Beijing (CN)

(72) Inventors: Dong Li, Beijing (CN); Yujun Yang, Beijing (CN)

(73) Assignee: CHIPONE TECHNOLOGY (BEIJING) CO., LTD., Beijing (CN)

( * ) Notice: Subject to any disclaimer, the term of this patent is extended or adjusted under 35 U.S.C. 154(b) by 353 days.

(21) Appl. No.: 16/628,008

(22) PCT Filed: Oct. 16, 2018

(86) PCT No.: PCT/CN2018/110479
§ 371 (c)(1),
(2) Date: Dec. 31, 2019

(87) PCT Pub. No.: WO2020/010742
PCT Pub. Date: Jan. 16, 2020

(65) Prior Publication Data
US 2021/0026795 A1    Jan. 28, 2021

(30) Foreign Application Priority Data

Jul. 9, 2018  (CN) .......................... 201810744753.1

(51) Int. Cl.
*G06F 13/42* (2006.01)
*H03M 13/37* (2006.01)

(52) U.S. Cl.
CPC ........ *G06F 13/4265* (2013.01); *H03M 13/37* (2013.01)

(58) Field of Classification Search
CPC .......................... G06F 13/4265; H03M 13/37
See application file for complete search history.

(56) References Cited

U.S. PATENT DOCUMENTS 7,895,301 B1 *   2/2011  Mui ..................... G06F 13/4286
                                                446/454
2008/0031167 A1 *  2/2008  Chen .................. H04L 25/4923
                                                370/298

(Continued)

FOREIGN PATENT DOCUMENTS

CN      101499043       8/2009
CN      103425618      12/2013

(Continued)

*Primary Examiner* — Phong H Dang
(74) *Attorney, Agent, or Firm* — Treasure IP Group, LLC

(57) ABSTRACT

A single-wire transmission method, a chip and a communication system are disclosed, wherein the single-wire transmission method comprises: receiving X sets of data to be transmitted, a trigger flag before each set of data to be transmitted and an end flag after each set of data to be transmitted through a single line, wherein X is a positive integer greater than 0, and each set of data to be transmitted is represented by the number of transition edges; confirming the trigger flag; counting the transition edge after confirming the trigger flag to obtain a number of the transition edges, performing a decoding process according to the number of the transition edges until the end flag is received, wherein the transition edges are recounted and the decoding process is re-performed after the end flag is received each time. The data transmission time is shorter, which improves the data transmission efficiency.

11 Claims, 5 Drawing Sheets

(56) References Cited

U.S. PATENT DOCUMENTS

| | | | |
|---|---|---|---|
| 2011/0095624 A1* | 4/2011 | Kung | G06F 13/4072 |
| | | | 307/130 |
| 2011/0185215 A1 | 7/2011 | Neben | |
| 2013/0336420 A1* | 12/2013 | Wu | H04L 25/4902 |
| | | | 375/295 |
| 2015/0074306 A1* | 3/2015 | Ayyagari | G06F 13/4072 |
| | | | 710/110 |
| 2016/0294544 A1* | 10/2016 | Jang | H04L 7/0054 |

FOREIGN PATENT DOCUMENTS

| | | |
|---|---|---|
| CN | 05045749 | 11/2015 |
| CN | 207586896 A | 7/2018 |
| CN | 110379396 A | 10/2019 |

\* cited by examiner

SINGLE-WIRE TRANSMISSION METHOD, CHIP AND COMMUNICATION SYSTEM

CROSS-REFERENCE TO RELATED APPLICATIONS

The present application claims the priority of the Chinese Patent Application No. 201810744753.1, filed on Jul. 9, 2018, entitled "Single-wire Transmission Method, Chip and Communication System", which is cited to the present application by referring to the entire specification, claims, drawings and abstract of the above-mentioned Chinese patent application.

BACKGROUND OF THE DISCLOSURE

Field of the Disclosure

The present disclosure relates to the field of integrated circuit design and communication, in particular, to a single-wire transmission method, a chip and a communication system.

Description of the Related Art

Existing communication interfaces such as I2C, SPI, SMBUS, etc. require at least two transmission wires, one for transmitting data and the other for transmitting clocks. If one transmission wire can be used to achieve data and clock transmission, the number of pins in the circuit can be reduced, and the problem of signal synchronization between different transmission wires or unsynchronized clocks between the receiving terminal and the transmitting terminal is avoided. FIG. 1 shows a view showing signals of a conventional single-wire transmission method. As shown in FIG. 1, after the start signal INIT ends, when the receiving terminal detects the first falling edge of the CTRL signal, it is enabled to start receiving data (as indicated by the waveform ENABLE), and correspondingly generates a frequency according to the CTRL signal (as shown by the frequency waveform), the counter at the receiving terminal starts counting the rising edge of the CTRL signal within the predetermined transmission time $T_{COUN}$. The occurrence of K rising edges during the predetermined transmission time $T_{COUN}$ indicates that a data to be transmitted is K and K is a positive integer greater than zero. If the data to be transmitted is 0, no rising edge of the CTRL signal may appear within the predetermined transmission time $T_{COUN}$.

The shortcomings of the prior art transmission methods are: regardless of the amount of data transmitted, at least a count time of the predetermined transmission time $T_{COUN}$ is required, and when the data to be transmitted is of high volume, it is necessary to increase the time of the predetermined transmission time $T_{COUN}$. When the data to be transmitted is small, it is still necessary to wait for the predetermined transmission time $T_{COUN}$ to end to achieve the data transmission. These shortcomings will result in poor versatility and low efficiency of data transmission of existing transmission methods.

SUMMARY OF THE DISCLOSURE

In view of this, the purpose of the present disclosure is to provide a single-wire transmission method and a chip comprising the single-wire transmission method and a communication system, which further improve the efficiency of the data transmission.

A single-wire transmission method is provided according to an aspect of the present disclosure and comprises: receiving X sets of data to be transmitted, a trigger flag before each set of the data to be transmitted and an end flag after each set of the data to be transmitted through a single line, wherein X is a positive integer greater than 0, and each set of the data to be transmitted is represented by a number of transition edges; confirming the trigger flag; counting the transition edges after confirming the trigger flag to obtain the number of the transition edges, and performing a decoding process according to the number of the transition edges until the end flag is received, wherein the transition edges are recounted and the decoding process is re-performed after the end flag is received each time.

Preferably, the end flag is represented by a high level or a low level that lasts for a first predetermined time.

Preferably, each of the transition edges includes a rising edge, or a falling edge, or a combination of both.

Preferably, a transmission start flag is configured in front of the trigger flag which is in front of a first set of data to be transmitted in the X sets of the data to be transmitted, and a transmission completion flag is further configured behind the end flag which is behind a last set of the data to be transmitted in the X sets of data to be transmitted; the single-wire transmission method further comprises decoding the X sets of data to be transmitted after receiving the transmission completion flag.

Preferably, the transmission start flag is represented by a high level or a low level that lasts for a second predetermined time; the transmission completion flag is represented by a high level or a low level that lasts for a third predetermined time.

Preferably, the trigger flag of the first set of the data to be transmitted is represented by a rising edge or a falling edge; the trigger flags of the second to X-th sets of the data to be transmitted are each represented by a rising edge or a falling edge, and a high level or a low level that lasts for a fourth predetermined time thereafter.

Preferably, the trigger flags of the first set to an X-th set of the data to be transmitted are each represented by a rising edge or a falling edge, and a high level or a low level that lasts for a fourth predetermined time thereafter.

Preferably, the fourth predetermined time is less than the third predetermined time.

Preferably, X=3, the X sets of data to be transmitted comprise a first set of the data to be transmitted, a second set of the data to be transmitted and a third set of the data to be transmitted; the first set of the data to be transmitted represents a storage address, the second set of the data to be transmitted represents a read/write identifier, and the third set of the data to be transmitted represents a stored data; performing the decoding process according to the number of the transition edges comprises converting the number of the transition edges corresponding to the first set of the data to be transmitted behind the trigger flag into the address, converting the number of the transition edges corresponding to the second set of the data to be transmitted into the read/write identifier, and converting the number of the transition edges corresponding to the third set of the data to be transmitted into the stored data.

A single-wire transmission method is provided according to another aspect of the present disclosure, comprising: receiving N bits of data to be transmitted, a trigger flag before each set of data to be transmitted and an end flag after each set of data to be transmitted through a single line, wherein the N bits of data to be transmitted is grouped by M bits and includes N/M groups, and each set of data to be transmitted is represented by K+1 transition edges; confirming the trigger flag; counting the K+1 transition edges after confirming the trigger flag, decoding according to the a count value until the end flag is received, and recounting and decoding the transition edges after the end flag is received each time, wherein the K is an integer greater than or equal to zero, the count value obtained according to the K+1 transition edges is K, and the K represents an equivalent value of a binary M bit, N and M being positive integers greater than 0, and N being divisible by M.

Preferably, if $n=T_{ST}/T_D$, a total transmission time T required to transmit N bits of data is $(N/M)*(n-1+2M+1)*TD$, wherein the $T_{ST}$ represents a first predetermined time, and the $T_D$ represents a pulse width of each set of data to be transmitted.

Preferably, N=8, and when the transmission time T is the shortest, the relationship between n and M satisfies: when n≤1, M=1; when 1<n≤17, M=2; when 17<n≤449, M=4; when n>449, M=8.

Preferably, M=1, and the decoding according to the count value comprises: decoding to 0 when the count of the transition edge is a first value; decoding to 1 when the count of the transition edge is a second value.

Preferably, M=2, and the decoding according to the count value comprises: decoding to 00 when the count of the transition edge is a first value; decoding to 01 when the count of the transition edge is a second value; decoding to 10 when the count of the transition edge is a third value; decoding to 11 when the count of the transition edge is a fourth value.

A chip is provided according to a third aspect of the present disclosure, transmitting data according to above single-wire transmission method.

A communication system is provided according to a fourth aspect of the present disclosure, transmitting data according to above single-wire transmission method.

In summary, the single-wire transmission method, the chip and the communication system provided by the present disclosure transmit data by a single transmission line, and use the end flag ST to indicate the end of the data transmission after the completion of transmission of each set of data, without predetermining the data transmission time during data transmission, so that the limitation of data length caused by the data transmission time is eliminated, thereby being compatible with transmission of higher volume of data. At the same time when smaller volume of data such as K=0 is transmitted, the data transmission time is shorter, which improves the data transmission efficiency. And the chip using the single-wire transmission method may reduce the number of pins in the circuit, save chip area, save cost, improve sealing and testing reliability, and improve signal synchronization.

In other embodiments of the present disclosure, the N bits of data to be transmitted are divided into [N/M] segments for transmitting each segment of M bits, thereby further improving transmission efficiency; a read/write bit is added after the address bit to read or write to the register.

BRIEF DESCRIPTION OF THE DRAWINGS

The above and other objects, features and advantages of the present disclosure will become more apparent from the description below with reference to the accompanying drawings.

DESCRIPTION OF THE EMBODIMENTS

Figure 1:
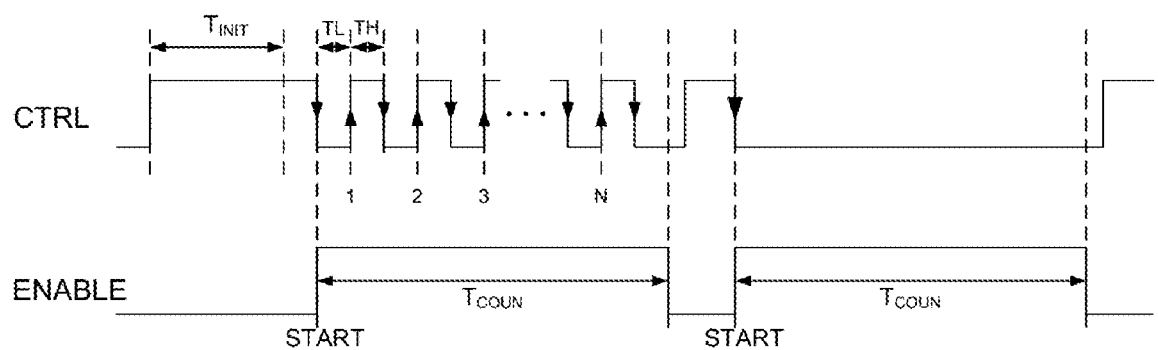
FIG. 1 is a signal view showing a conventional single-wire transmission method.

The present disclosure will be described in more detail below with reference to the accompanying drawings. In the various figures, the same elements are denoted by the similar reference numerals. For the sake of clarity, the various parts in the figures are not drawn to scale. In addition, some well-known parts may not be shown in the figures.

Figure 2:
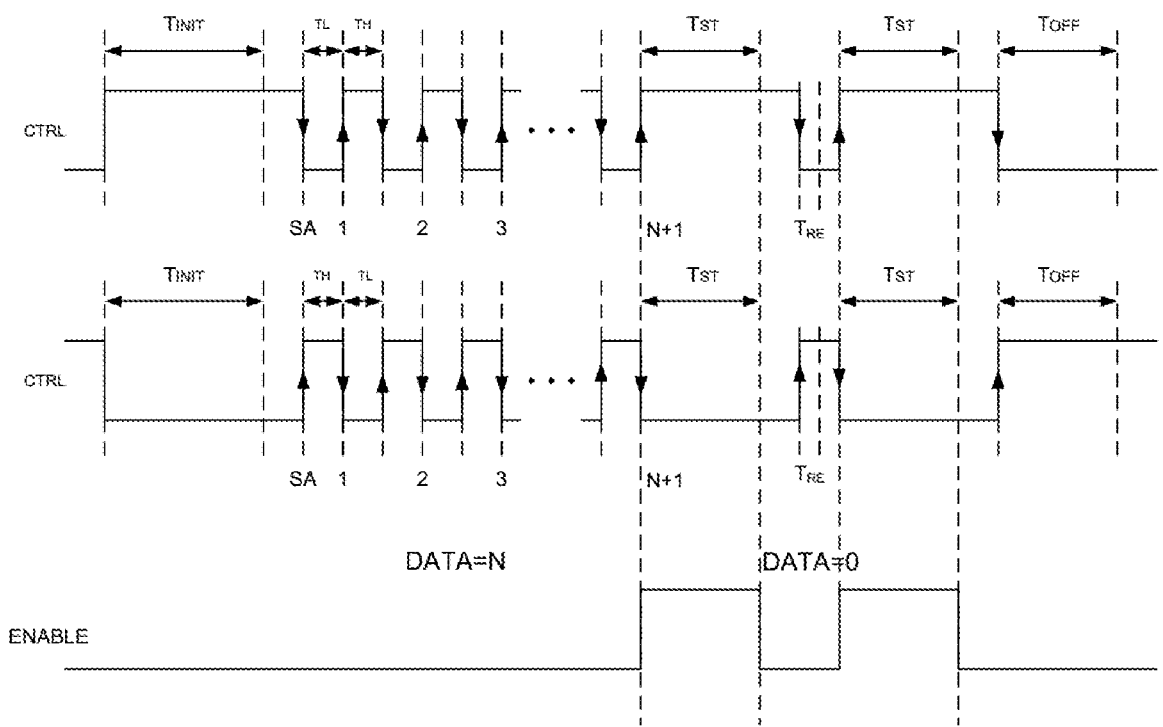
FIG. 2 is a signal view showing a method of transmitting continuous data according to the first embodiment of the present disclosure.

FIG. 2 is a signal view showing a method of transmitting continuous data according to the first embodiment of the present disclosure. Among which, FIG. 2 shows two embodiments of bus signals received by a circuit of a receiving terminal. The difference between the two bus signals is that basic voltage levels are different, one is at a high level and the other is at a low level. The transmission method provided by the first embodiment of the present disclosure comprises: determining a transmission start flag INIT, and the transmission start flag INIT is, for example, a high level signal that lasts for a second predetermined time as shown in the top of FIG. 2, or a low level signal that lasts for the second predetermined time as shown in the bottom of FIG. 2. A trigger flag SA after the transmission start flag INIT is provided to indicate a start of this transmission; the trigger flag SA is, for example, a first falling edge or a first rising edge of the bus signal CTRL, and of course, may be a more complex trigger signal. The falling edge is taken as an example of the trigger flag SA according to the embodiment shown in the top of FIG. 2, the rising edge is taken as an example of the trigger flag SA according to the embodiment shown in the bottom of FIG. 2. The trigger flag SA triggers a counter of the receiving terminal, the counter counts a number of the rising edges (or falling edges) of the bus signal CTRL. A counting result obtained by the counter may be encoded and decoded in a variety of ways. According to the embodiment shown in FIG. 2, data to be transmitted is represented by the number of rising edges (or falling edges), for example, the occurrence of K+1 rising edges (or falling edges) indicates that the data to be transmitted is K. The occurrence of 1 rising edge (or falling edge) indicates that the data to be transmitted is 0. An end flag ST is provided after K+1 rising edges (or falling edges); the end flag ST is at a same level that does not change for a first predetermined time, indicating that the transmission of this set of data ends. For example, the end flag ST shown in the top of FIG. 2 is a high level that lasts for a $T_{ST}$ duration, and the end flag ST shown in the bottom of FIG. 2 is a low level that lasts for the $T_{ST}$ duration.

When the second set of data is required to be transmitted, a set of trigger flags SA are again provided, for example, the trigger flag SA of the second set of data to be transmitted shown in the top of FIG. 2 is a falling edge and then is at a low level that lasts for a fourth predetermined time thereafter. At the same time, when the fourth predetermined time is larger than the minimum value of a duration TL of the low level during the previous process of counting the rising edges and is smaller than a duration $T_{OFF}$ of a transmission completion flag OFF, the rising edge may start to be counted, and then the high level is maintained for duration $T_{ST}$ after a last rising edge, so as to indicate that the transmission of the second set of data is completed.

The transmission completion flag OFF is provided after the X sets of data to be transmitted are written, and the transmission completion flag OFF is a high level or a low level that lasts for a third predetermined time. For example, the transmission completion signal OFF shown in the top of FIG. 2 is a low level that lasts for the duration of the $T_{OFF}$.

The above embodiments only illustrate one solution of the present disclosure. In other embodiments of the present disclosure, all the trigger flags SA of the first to X-th sets of data to be transmitted may each be one falling edge and a low level that last for the fourth predetermined time thereafter. At the same time, when the fourth predetermined time is larger than the minimum value of the duration TL of the low level during the process of counting the rising edges and is smaller than the duration $T_{OFF}$ of the transmission completion flag OFF, the rising edge may start to be counted. The present disclosure is not limited thereto, and those skilled in the art may select according to specific situations.

The transmission method provided by the first embodiment of the present disclosure uses the end flag ST to indicate the end of the data transmission after each set of data is transmitted completely, without predetermining the data transmission time during data transmission, so that the limitation of data length caused by the data transmission time is eliminated, thereby the transmission method can be compatible with transmission of higher volume of data. At the same time when smaller data such as K=0 is transmitted, the data transmission time is shorter, which improves the data transmission efficiency.

FIG. 2 shows a transmission mode for continuous data. In a preferred embodiment of the present disclosure, a transmission mode of data is provided, and similar to above embodiments, the transmission method provided by the preferred embodiment comprises: receiving a bus signal including N bits of data to be transmitted through a single wire, and transmitting the N bits of data to be transmitted set by set, wherein each set of data to be transmitted has M bits of data, and the bus signal further comprises a trigger flag before each set of data to be transmitted and an end flag after each set of data to be transmitted, wherein each set of data to be transmitted is represented by K+1 transition edges in the bus signal; confirming the trigger flag in the bus signal; counting the K+1 transition edges in the bus signal after confirming the trigger flag to obtain a count value, performing decoding process according to the count value until the end flag is received; and recounting the transition edges and re-performing the decoding process after the end flag is received each time, wherein the K is an integer greater than or equal to zero, the count value obtained according to the K+1 transition edges is K, and the K represents an equivalent value of M-bit binary data, both N and M are positive integers greater than 0, N may be divisible by M.

Figure 3:
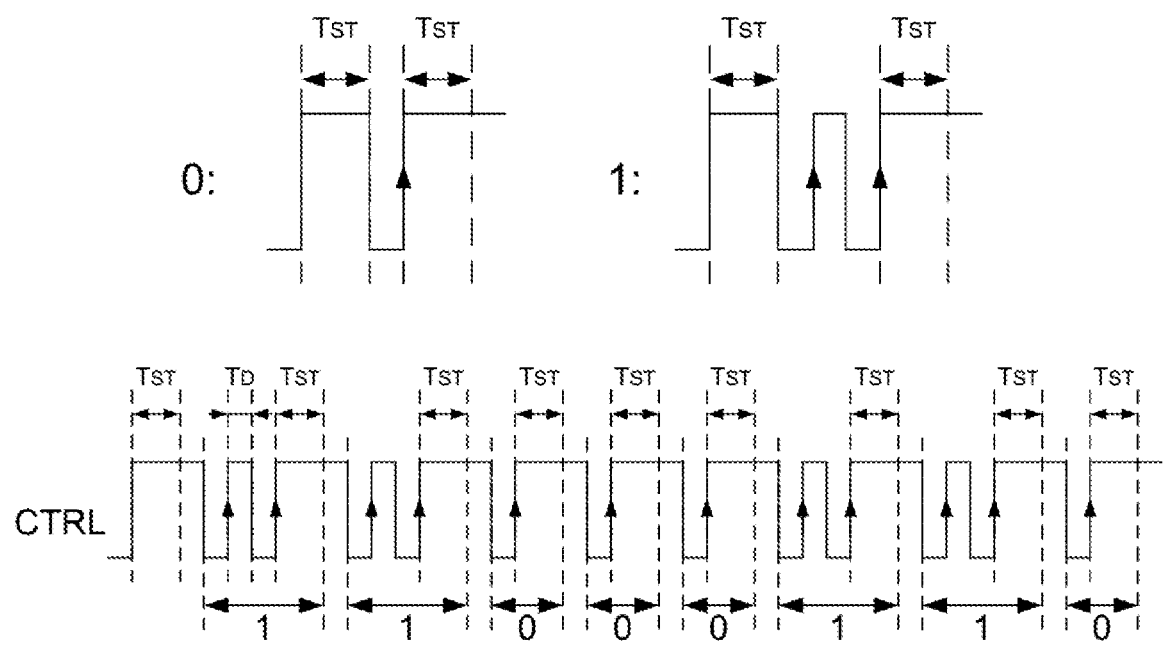
FIG. 3 is a signal view showing a method of transmitting single bit of data according to the second embodiment of the present disclosure.

For example, FIG. 3 is a signal view showing a method of transmitting single-bit data according to the second embodiment of the present disclosure. The transmission method provided by the second embodiment of the present disclosure transmits each bit of data separately. As shown in FIG. 3, pulling down the bus signal CTRL indicates the start of data transmission, only one rising edge appearing during data transmission indicates that the bit data is 0, and two rising edges appearing during data transmission indicates that the bit data is 1; the end flag ST is provided after each set of data is transmitted completely, wherein the end flag ST is, similar to the first embodiment, kept at a same level with no change for the first predetermined time, as shown in the top of FIG. 3, the end flag ST is a high level that lasts for $T_{ST}$ duration.

Of course, in other embodiments of the present disclosure, rising up the bus signal CTRL indicates the start of data transmission, only one falling edge appearing during data transmission indicates that the bit data is 0, and two falling edges appearing during data transmission indicates that the bit data is 1; the end flag ST is provided after each set of data is transmitted completely, wherein the end flag ST is a low level that lasts for $T_S T$ duration. The present disclosure is not limited thereto, and those skilled in the art may select according to specific situations.

The bottom of FIG. 3 shows a waveform view of transmitting data 1100 0110 (C6H) according to the second embodiment of the present disclosure. As shown, the time required to transmit data 0 is $T_{ST}+T_D$, and the time required to transmit data 1 is $T_{ST}+3T_D$, wherein TD represents the duration of one pulse during data transmission, i.e. the pulse width of the data to be transmitted. The time required for transmitting 8 bits of data is between $8T_{ST}+8T_D$ and $8T_{ST}+24T_D$, thus the transmission efficiency can be improved.

Figure 4:
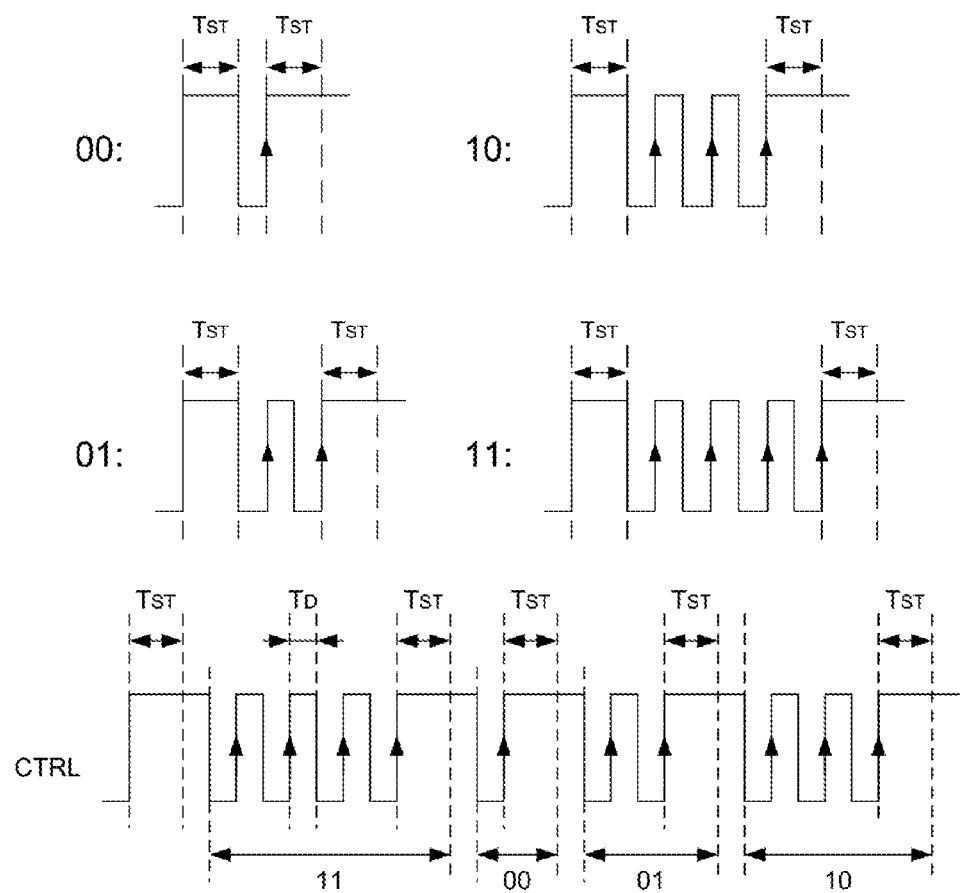
FIG. 4 is a signal view showing a method of transmitting multiple bits of data according to the third embodiment of the present disclosure.

FIG. 4 is a signal view showing a method for transmitting two bits of data according to the third embodiment of the present disclosure. In the transmission method provided by the third embodiment of the present disclosure, 8 bits of data are divided into four sets, each set of data consisting of adjacent 2 bits of data. The steps of starting the data transmission and ending the data transmission are the same as those of the second embodiment, and are not described herein again. The transmission method provided by the third embodiment of the present disclosure differs from the transmission method provided by the second embodiment in that the number of rising edges (or falling edges) being 1 represents data 00, the number of rising edges (or falling edges) being 2 represents data 01, the number of rising edges (or falling edges) being 3 represents data 10, and the number of rising edges (or falling edges) being 4 represents data 11, as shown in the top of the FIG. 4.

The bottom of FIG. 4 shows a waveform view of transmitting data 1100 0110 (C6H) according to the third embodiment of the present disclosure. As shown, the time required to transmit data 00 is $T_{ST}+T_D$, the time required to transmit data 01 is $T_{ST}+3T_D$, the time required to transmit data 10 is $T_{ST}+5T_D$, and the time required to transmit data 11 is $T_{ST}+7T_D$. Therefore, the time required for transmitting 8 bits of data by the transmission method according to the third embodiment of the present disclosure is between $4T_{ST}+4T_D$ and $4T_{ST}+28T_D$.

In addition, in other embodiments of the present disclosure, a data transmission method is provided to maximize the efficiency of data transmission. In the present embodiment, N bits of data to be transmitted are transmitted set by set, wherein each set of data to be transmitted has M bits, and a total number of sets is N/M, wherein both N and M are positive integers greater than 0, and N may be divisible by M. Assuming $n=T_{ST}/T_D$, wherein $T_{ST}$ represents a duration of the end flag and TD represents the width of a single pulse during data transmission, the total transmission time T required to transmit N bits of data is $(N/M)*(n-1+2^{M+1})*T_D$.

Because the minimum time required to transmit a set of data is $T_{ST}+T_D$, and the longest time required is $T_{ST}+(2^{M+1}-1)TD$, the shortest total transmission time T required to transmit N bits of data is:

$$[N/M]*(T_{ST}+T_D)$$

the longest total transmission time T required to transmit N bits of data is:

$$[N/M]*[T_{ST}+(2^{M+1}-1)T_D]$$

taking N=8 as an example, the results as shown in Table 1 may be obtained.

TABLE 1

| N = 8 | Tmin | Tmax |
|---|---|---|
| M | $(8/M)*(n + 1)T_D$ | $(8/M)*[n+ (2^{M + 1}-1)] T_D$ |
| 1 | $8*(n + 1) T_D$ | $(8n + 24) T_D$ |
| 2 | $4*(n + 1) T_D$ | $(4n + 28) T_D$ |
| 4 | $2*(n + 1) T_D$ | $(2n + 62) T_D$ |
| 8 | $1*(n + 1) T_D$ | $(n + 511) T_D$ |

According to the formula in Table 1, a transmission efficiency optimization table may be obtained to obtain the value of M which may make Tmax minimum when n is any value. The results are shown in Table 2.

TABLE 2

| $n \leq 1$ | $M = 1$ |
|---|---|
| $1 < n \leq 17$ | $M = 2$ |
| $17 < n \leq 449$ | $M = 4$ |
| $n > 449$ | $M = 8$ |

According to the results of Table 2, a corresponding value of M may be selected for different values of n, so that the data to be transmitted can be transmitted with a set of M bits, so as to maximize the efficiency of data transmission.

Figure 5:
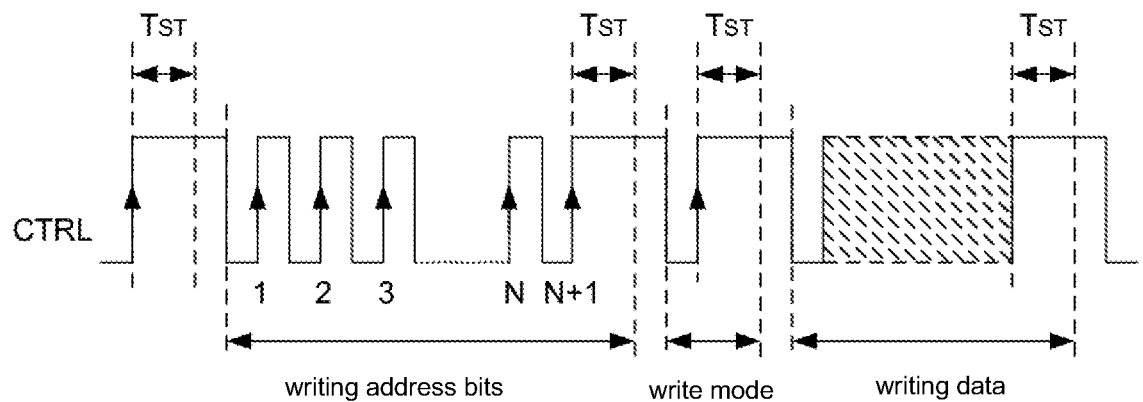
FIG. 5 is a signal view showing a write mode of a transmission method according to the fourth embodiment of the present disclosure.
Figure 6:
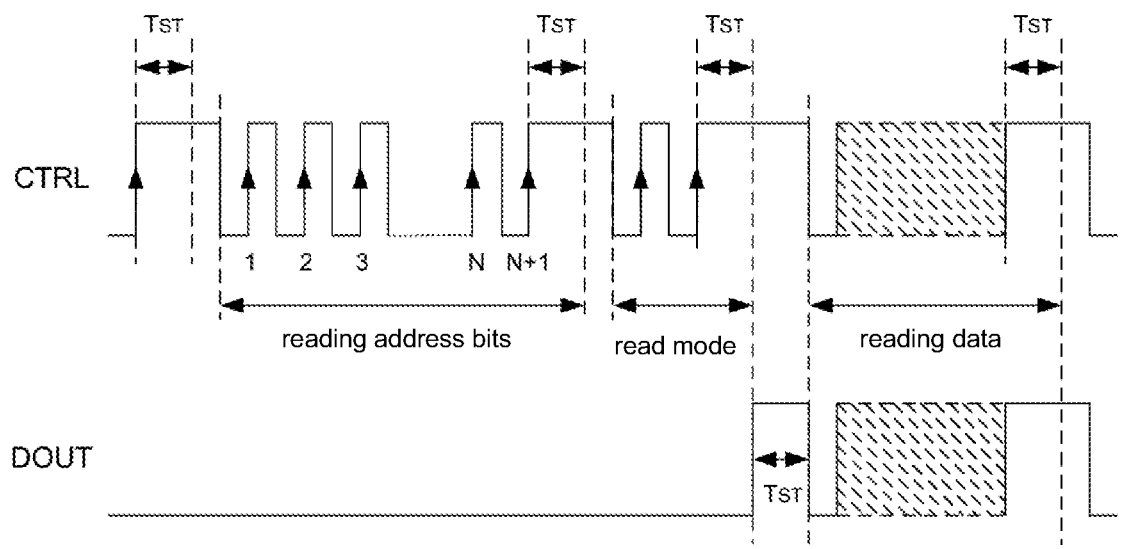
FIG. 6 is a signal view showing a read mode of a transmission method according to the fourth embodiment of the present disclosure.

FIGS. 5 and 6 is a signal view showing a write mode and a read mode of a transmission method respectively according to the fourth embodiment of the present disclosure. As shown in FIGS. 5 and 6, the fourth embodiment of the present disclosure provides a transmission method with read and write modes, comprising beginning to write/read address bits at the first falling edge after the bus signal CTRL is raised for $T_{ST}$ duration, obtaining the number of registers to be written/read by counting the number of rising edges, providing the end flag ST to end transmission of the address bits upon read/write mode, for example, as shown in the figures, the bus signal CTRL is pulled up to a high level for $T_{ST}$ duration to end the transmission of the address bits. The read mode or the write mode starts to be selected at a next falling edge, wherein the write mode or read mode is selected according to the counted number of rising edges; as shown in FIGS. 5 and 6, one rising edge indicates the write mode and two rising edges indicate the read mode. The end flag ST is provided after the read/write mode is selected, for example, the bus signal CTRL is pulled up to a high level that lasts for $T_{ST}$ duration to end the selection between the read mode and the write mode. The register data starts to be written/read at the first falling edge after the selection between the read mode and the write mode ends, wherein the method of writing/reading the register data is the same as that of the above embodiments, and details are not described herein again.

The above embodiments show a transmission method with the read/write mode when the bus signal CTRL is at a low level. The transmission method of the fourth embodiment of the present disclosure is also applicable to the case where the bus signal CTRL is at a high level. When the bus signal CTRL is at a high level, the start of the transmission is indicated by pulling down the bus signal CTRL, the writing/reading of the address bits is started at the first rising edge, and the number of registers is obtained by counting the number of falling edges during transmission. Similarly, in the read/write mode selection, one falling edge indicates a write mode and two falling edges indicate a read mode. The end flag ST is provided after the read/write mode is selected, for example, the bus signal CTRL is pulled down to the low level for $T_{ST}$ duration is to end the read/write mode selection. The register data starts to be written or read at the first rising edge after the end of the read/write mode selection.

According to other embodiments of the present disclosure, a chip is provided to transmit data according to the single-wire transmission method of above embodiments.

According to other embodiments of the present disclosure, a communication system is provided to transmit data according to the single-wire transmission method of above embodiments.

In summary, the single-wire transmission method, the chip and the communication system provided by the present disclosure transmit data by a single transmission wire, and use the end flag ST to indicate the end of the data transmission after the completion of transmission of each set of data, without predetermining the data transmission time during data transmission, so that the limitation of data length caused by the data transmission time is eliminated, and higher volume of data transmission can be transmitted. At the same time when smaller data such as K=0 is transmitted, the data transmission time is shorter, thus the data transmission efficiency can be improved. And the chip using the single-wire transmission method may reduce the number of pins in the circuit, so that chip area is saved, cost is saved, sealing and testing reliability is improved, and signal synchronization is improved.

In other embodiments of the present disclosure, the N bits of data to be transmitted are divided into [N/M] segments for transmitting each segment of M bits, thereby further improving transmission efficiency; and a read/write bit is added after the address bit to read or write to the register.

It is to be explained that the relationship terms, such as "first" and "second", are used herein only for distinguishing one entity or operation from another entity or operation but do not necessarily require or imply that there exists any actual relationship or sequence of this sort between these entities or operations. Furthermore, terms "comprising", "including" or any other variants are intended to cover the non-exclusive including, thereby making that the process, method, merchandise or device comprising a series of elements comprise not only those elements but also other elements that are not listed explicitly or the inherent elements to the process, method, merchandise or device. In the case of no more limitations, the element limited by the sentence "comprising a . . . " does not exclude that there exists another same element in the process, method, merchandise or device comprising the element.

The embodiments in accordance with the present disclosure, as described above, are not described in detail, and are not intended to limit the present disclosure to be only the described particular embodiments. Obviously, many modifications and variations are possible in light of the above. These embodiments has been chosen and described in detail by the specification to explain the principles and embodiments of the present disclosure so that those skilled in the art can make good use of the present disclosure and the modified use based on the present disclosure. The disclosure is to be limited only by the scope of the appended claims and the appended claims and equivalents thereof.

What is claimed is:

1. A single-wire transmission method, comprising:
receiving X sets of data to be transmitted, a trigger flag before each set of the data to be transmitted and an end flag after each set of the data to be transmitted through a single wire, wherein X is a positive integer greater than 0, and each set of the data to be transmitted is represented by a number of transition edges;
confirming the trigger flag;
counting the transition edges after confirming the trigger flag to obtain the number of the transition edges, and performing a decoding process according to the number of the transition edges until the end flag is received, wherein the transition edges are recounted and the decoding process is re-performed after the end flag is received each time,
wherein a transmission start flag is configured in front of the trigger flag which is in front of a first set of the data to be transmitted in the X sets of the data to be transmitted, and a transmission completion flag is further configured behind the end flag which is behind a last set of the data to be transmitted in the X sets of the data to be transmitted.

2. The single-wire transmission method according to claim 1, wherein the end flag is represented by a high level or a low level that lasts for a first predetermined time.

3. The single-wire transmission method according to claim 1, wherein each of the transition edges includes a rising edge, or a falling edge, or a combination of both.

4. The single-wire transmission method according to claim 1, wherein the single-wire transmission method further comprises decoding the X sets of the data to be transmitted after receiving the transmission completion flag.

5. The single-wire transmission method according to claim 1, wherein, the transmission start flag is represented by a high level or a low level that lasts for a second predetermined time;
the transmission completion flag is represented by a high level or a low level that lasts for a third predetermined time.

6. The single-wire transmission method according to claim 5, wherein the trigger flag of the first set of the data to be transmitted is represented by a rising edge or a falling edge;
the trigger flags of a second set to an X-th set of the data to be transmitted are each represented by a rising edge or a falling edge, and a high level voltage or a low level that lasts for a fourth predetermined time thereafter.

7. The single-wire transmission method according to claim 5, wherein the trigger flags of the first set to an X-th set of the data to be transmitted are each represented by a rising edge or a falling edge, and a high level or a low level that lasts for a fourth predetermined time thereafter.

8. The single-wire transmission method according to claim 6, wherein the fourth predetermined time is less than the third predetermined time.

9. The single-wire transmission method according to claim 1, wherein X=3, and the X sets of the data to be transmitted comprise a first set of data to be transmitted, a second set of the data to be transmitted and a third set of the data to be transmitted; the first set of the data to be transmitted represents a storage address, the second set of the data to be transmitted represents a read/write identifier, and the third set of the data to be transmitted represents a stored data;
performing the decoding process according to the number of the transition edges comprises:
converting the number of the transition edges corresponding to the first set of the data to be transmitted behind the trigger flag into the storage address, converting the number of the transition edges corresponding to the second set of the data to be transmitted into the read/write identifier, and converting the number of the transition edges corresponding to the third set of the data to be transmitted into the stored data.

10. A chip, configured to execute the single-wire transmission method according to claim 1.

11. A communication system, configured to execute the single-wire transmission method according to claim 1.

* * * * *